United States Patent
Ellä et al.

(10) Patent No.: US 6,518,860 B2
(45) Date of Patent: Feb. 11, 2003

(54) BAW FILTERS HAVING DIFFERENT CENTER FREQUENCIES ON A SINGLE SUBSTRATE AND A METHOD FOR PROVIDING SAME

(75) Inventors: Juha Ellä, Halliko (FI); Helena Pohjonen, Espoo (FI)

(73) Assignee: Nokia Mobile Phones Ltd, Espoo (FI)

( * ) Notice: Subject to any disclaimer, the term of this patent is extended or adjusted under 35 U.S.C. 154(b) by 0 days.

(21) Appl. No.: 09/755,007

(22) Filed: Jan. 5, 2001

(65) Prior Publication Data

US 2002/0089395 A1 Jul. 11, 2002

(51) Int. Cl.⁷ .............................. H03H 9/56; H03H 3/04
(52) U.S. Cl. ....................... 333/189; 333/188; 333/191; 29/25.35
(58) Field of Search ................................ 333/186–192, 333/133; 29/25.35

(56) References Cited

U.S. PATENT DOCUMENTS

| | | | | |
|---|---|---|---|---|
| 3,569,750 A | * | 3/1971 | Beaver | 310/320 |
| 3,838,366 A | * | 9/1974 | Coussot | 333/192 |
| 5,319,324 A | * | 6/1994 | Satoh et al. | 331/158 |
| 5,630,949 A | * | 5/1997 | Lakin | 216/61 |
| 5,692,279 A | * | 12/1997 | Mang et al. | 29/25.35 |
| 5,698,928 A | * | 12/1997 | Mang et al. | 310/322 |
| 5,714,917 A | | 2/1998 | Ella | 332/144 |
| 5,821,833 A | * | 10/1998 | Lakin | 333/187 |
| 5,872,493 A | * | 2/1999 | Ellä | 333/191 |
| 5,873,154 A | | 2/1999 | Ylilammi et al. | 29/25.35 |
| 5,910,756 A | | 6/1999 | Ella | 333/133 |
| 6,051,907 A | * | 4/2000 | Ylilammi | 310/312 |
| 6,060,818 A | | 5/2000 | Ruby et al. | 310/363 |
| 6,107,721 A | * | 8/2000 | Lakin | 310/321 |
| 6,306,313 B1 | * | 10/2001 | Fetter et al. | 216/67 |

FOREIGN PATENT DOCUMENTS

| | | |
|---|---|---|
| EP | 0880227 | 11/1998 |
| EP | 0949756 | 10/1999 |

OTHER PUBLICATIONS

"Face–Mounted Piezoelectric Resonators," by W.E. Newell, from Proceedings of the IEEE, Jun. 1965, pp. 675–581.

"Acoustic Bulk Wave Composite Resonators," by K.M. Lakin and J.S. Wang, from *Applied Physics Letter*, Feb. 1, 1981, vol. 38, No. 3, pp. 125–127.

(List continued on next page.)

Primary Examiner—Robert Pascal
Assistant Examiner—Barbara Summons
(74) Attorney, Agent, or Firm—Ware, Fressola, Van Der Sluys & Adolphson LLP (57) ABSTRACT

A method of fabricating a plurality of bulk acoustic wave (BAW) resonators on a single substrate, and the corresponding product, the BAW resonators having substantially different resonant frequencies, the method including the steps of: providing a substrate having an upper facing surface; depositing an isolation structure on the upper facing surface of the substrate; depositing a first metallic layer on the isolation structure, the first metallic layer serving as a bottom electrode; and depositing piezolayer material on the bottom electrode so as to have thicknesses corresponding to each of the different resonant frequencies, each different thickness located in a location where a resonator having a resonant frequency corresponding to the thickness is to be located. In one of several embodiments, the step of depositing piezolayer material on the bottom electrode itself includes the steps of: depositing piezolayer material to a thickness corresponding to the lowest frequency resonator; providing hard mask material over areas where the lowest frequency resonators are to be located; and removing the piezolayer material down to the thickness of the next higher frequency resonators. In some applications of the method, the isolation structure is an acoustic mirror, and the method further includes the step of providing the acoustic mirror, interposed between the substrate and the bottom electrode, according to a design that imparts to the acoustic mirror a desired reflection coefficient over a predetermined range of frequency including the substantially different resonant frequencies.

10 Claims, 9 Drawing Sheets

OTHER PUBLICATIONS

"Development of Miniature Filters for Wireless Applications," by K.M. Lakin, G.R. Kline and K.T. McCarron, from *IEEE Transactions on Microwave Theory and Techniques*, Dec. 1995, vol. 43, No. 12, pp. 2933–2939.

"FBAR Technology Shrinks CDMA Handset Duplexers," by D. McNamara, from *Microwaves & RF*, Sep. 2000, pp. 71–79.

"Thin Film ZnO Based Bulk Acoustic Mode Filters," by C.W. Seabury, P.H. Kobrin, R. Addison and D.P. Havens form *IEEE MTT–S Digest*, Jun. 1997, pp. 181–184.

European Patent Office Search Report dated May 22, 2002 (3p.).

"*Filter Banks Implemented With Integrated Thin Film Resonators,*" by K.M. Lakin, K.T. McCarron, J. Belsick and R. Rose, 2000 IEEE Ultrasonics Symposium, XP–002197837, pp. 851–854, Oct. 2000.

\* cited by examiner

BAW FILTERS HAVING DIFFERENT CENTER FREQUENCIES ON A SINGLE SUBSTRATE AND A METHOD FOR PROVIDING SAME

FIELD OF THE INVENTION

The present invention pertains to the field of fabricating bulk acoustic wave resonator, and more particularly to the field of fabricating, on a single substrate, more than one filter, each filter including at least two such resonators.

BACKGROUND OF THE INVENTION

It is known in the art to provide a so-called bulk acoustic wave (BAW) resonator, which includes a piezolayer sandwiched between two metallic layers that serve as electrodes. Such an assembly has a resonant frequency, with the thickness of the piezolayer the predominant factor in determining the resonant frequency, and so is often used as a component of a radiofrequency (RF) filter, as in for example mobile phone equipment. A typical example of such a filter is the so-called ladder filter, which often includes two such resonators, a series resonator (placed in series with the signal to be filtered) and a shunt resonator (shunting the signal to be filtered), and in fact can include a series combination of several such resonator pairs. (Other known filter types exist as well, such as a so-called lattice filter.) Besides the thickness of the piezolayer, the thickness and material used for others of the layers of a BAW resonator affect the resonant frequency of the resonator. In case of a series and shunt resonator pair, the two resonators are usually made the same except for adding a thin tuning layer to one or the other to shift slightly its resonant frequency compared to the other of the pair. The pair, which can serve by itself as a filter or as one stage in a ladder filter of several stages of such pairs, thus has what is called a center frequency, i.e. a frequency essentially midway between passband edges and so close to the series resonance frequency of the series resonator and at or close to the parallel resonant frequency of the shunt resonator.

BAW resonators according to the prior art are either bridge-type resonators, fabricated on one face of a thin membrane, with an air interface below the membrane and another air interface on top of the upper surface of the resonator, or acoustic-mirror type resonators fabricated on one face of a so-called acoustic mirror, which is in turn deposited on a substrate. An acoustic mirror consists of layers of various materials having alternately high and low acoustic impedance each having an approximately $\lambda/4$ thickness.

Both acoustic mirrors and membranes are here called isolation structures, because both structures acoustically isolates a BAW resonator section, consisting of the piezolayer and electrodes, from the underlying substrate.

In fabricating a BAW resonator, a process is used in which many BAW resonators are fabricated on what is termed a wafer, a usually four to eight-inch diameter silicon or glass disk. Usually thousands of BAW resonators are fabricated on such a wafer and then the wafer is sawed into individual chips. The portion of the wafer included in a chip is called here a substrate, to distinguish it from the whole wafer.

With the advent of multiband mobile phones, there is motivation to provide greater integration of those multiband mobile phone components that provide similar functionality, such as all components that provide filtering. Rather than providing a discrete RF filter for each frequency received or transmitted by a multiband mobile phone, it would be advantageous to provide the different filters on a single substrate (which would be sawed from a wafer on which thousands of such filters would be fabricated). However, although it is known in the art to provide both BAW resonators of a single-stage filter on a single substrate, or several such pairs making up a ladder filter on a single substrate, the prior art does not teach how to overcome the obstacle of fabricating on a single substrate several BAW filters with substantially different center frequencies and so having substantially different thicknesses of the piezolayer. Instead, the prior art teaches fabricating different filters (with substantially different center frequencies) on different substrates, and then combining the individually packaged filters into one module, a module that is unavoidably larger and usually more costly than a single-substrate multi-band filter.

Therefore, what is needed is a method of fabricating several BAW filters with substantially different center frequencies on a single substrate, a method that ideally includes only a small number of additional steps compared to the process of providing a single BAW filter on a substrate.

SUMMARY OF THE INVENTION

Accordingly, the present invention provides a method of fabricating a plurality of bulk acoustic wave (BAW) resonators on a single substrate, and the corresponding product, the BAW resonators having substantially different resonant frequencies, the method including the steps of: providing a substrate having an upper facing surface; depositing an isolation structure on the upper facing surface of the substrate; depositing a first metallic layer on the isolation structure, the first metallic layer serving as a bottom electrode; and depositing piezolayer material on the bottom electrode so as to have thicknesses corresponding to each of the different resonant frequencies, each different thickness located in a location where a resonator having a resonant frequency corresponding to the thickness is to be located.

In a further aspect of the invention, the step of depositing piezolayer material on the bottom electrode itself includes the steps of: depositing piezolayer material to a thickness corresponding to the lowest frequency resonator; providing hard mask material over areas where the lowest frequency resonators are to be located; and removing the piezolayer material down to the thickness of the next higher frequency resonators.

In another, further aspect of the invention, the step of depositing piezolayer material on the bottom electrode itself includes the steps of: depositing the piezolayer material to a thickness corresponding to the highest frequency; depositing a lift-off mask where the highest frequency resonators are to be located; depositing additional piezolayer material to a thickness corresponding to the next highest frequency; and removing the lift-off mask.

In yet still another, further aspect of the invention, the step of depositing piezolayer material on the bottom electrode itself includes the steps of: depositing the piezolayer material to a thickness corresponding to the highest frequency; depositing hard mask material where the highest frequency resonators are to be located; depositing additional piezolayer material to a thickness corresponding to the next highest frequency; and depositing hard mask material where the next highest frequency resonators are to be located.

In yet still even another, further aspect of the invention, the isolation structure is an acoustic mirror, and the method further includes the step of providing the acoustic mirror, interposed between the substrate and the bottom electrode, according to a design that imparts to the acoustic mirror a desired reflection coefficient over a predetermined range of frequency including the substantially different resonant frequencies.

BRIEF DESCRIPTION OF THE DRAWINGS

The above and other objects, features and advantages of the invention will become apparent from a consideration of the subsequent detailed description presented in connection with accompanying drawings, in which.

BEST MODE FOR CARRYING OUT THE INVENTION

Figure 1:
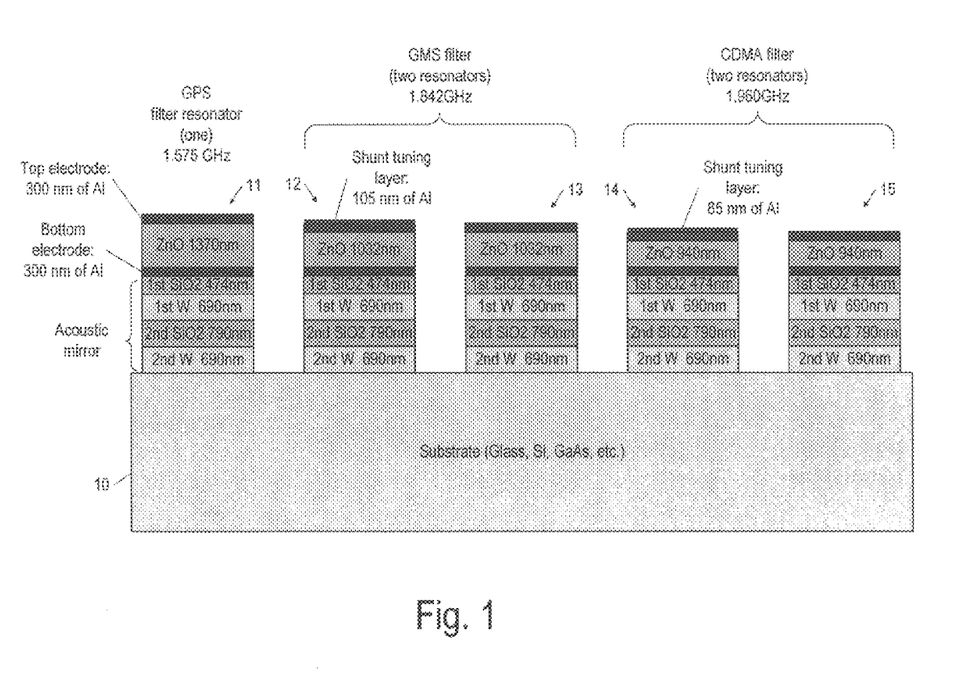
FIG. 1 is an elevation view of layer stacks for resonators that can be used in a multiband BAW filter with all resonators on a single substrate, according to the invention.
Figure 2:
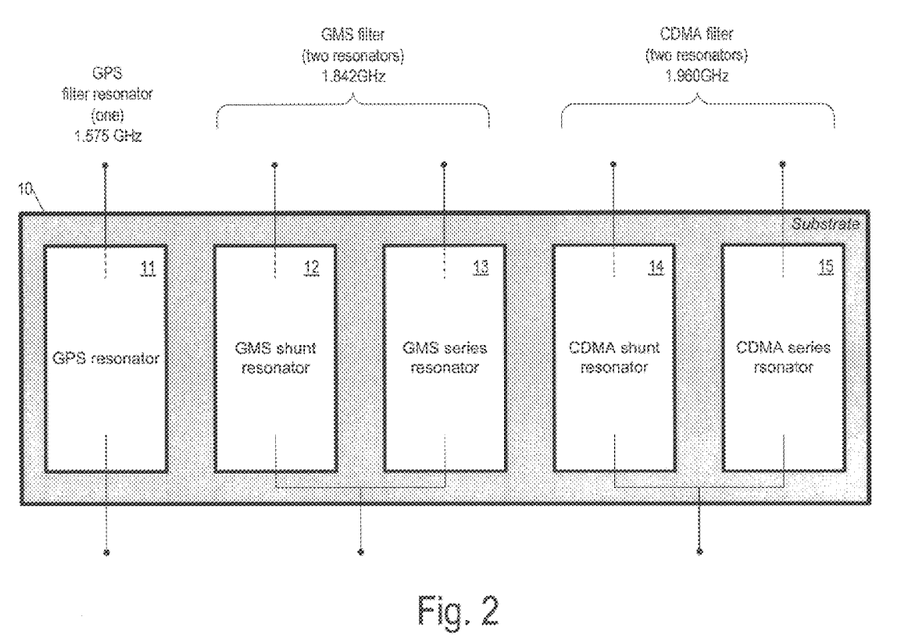
FIG. 2 is a plan view corresponding to FIG. 1.
Figure 3:
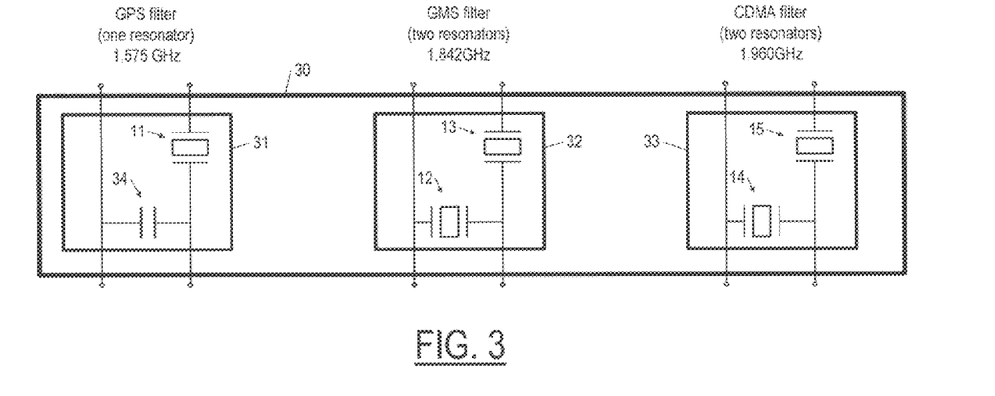
FIG. 3 is a schematic of a multi-band filter using the resonators shown in FIGS. 1 and 2.

Referring now to FIGS. 1–3, the invention will now be described for the particular application of a multi-band bulk acoustic wave (BAW) filter 30 (FIG. 3) consisting of a Global Positioning System (GPS) filter 31 with a passband centered at 1.575 GHz, a GMS filter 32 with a passband centered at 1.842 GHz, and a code division multiple access (CDMA) filter 33 with a passband centered at 1.960 GHz. The GPS filter uses only a single BAW resonator 11 in combination with a capacitor 34 to form what is called an L-section of a filter, whereas the two other filters 32 33 each include two BAW resonators 12–15, a series BAW resonator 13 15 and a shunt BAW resonator 12 14, each pair of such filters forming an L-section. (Actually, for clarity, FIGS. 1–3 show only one of each of three filters actually used, with the GPS filter using three L-sections connected in series so as to form a ladder filter, each L-section consisting of a resonator and a capacitor and with the GMS and CDMA filters each using three L-sections connected in series so as to form two ladder filters, each L-section consisting of a shunt resonator and a series resonator.) According to the invention, all of the BAW resonators 11–15 of the multi-band filter 30 are fabricated on a single substrate 10. Filters such as in the particular application being described are advantageously used in various applications, such as for example in a mobile phone, because of their combination of a high quality factor and high power rating, compared to surface acoustic wave (SAW) filters or ceramic filters.

The chief factor affecting the center frequency of the different filters/ bands of the multi-band filter 30 is the thickness of the piezolayer for the different resonators used as part of the different filters. As indicated in FIG. 1, the piezolayer in the particular application used to illustrate the preferred embodiment of the invention is made of ZnO for each of the resonators 11–15 of the multi-band filter 30. For the GPS filter 31, the thickness is 1370 nm, whereas for the GMS filter 32, the thickness of both (series and shunt) resonators is 1032 nm, i.e 350 nm thinner, with a center frequency correspondingly higher than that of the GPS filter. For the CDMA filter 33, the thickness is 940 nm, i.e. 98 nm thinner than the piezolayers of the two GMS resonators; the CDMA filter has a center frequency that is correspondingly higher than that of the GMS filter. With the exception of tuning layers (FIG. 1) used for the shunt resonators of the GMS and CDMA filters as explained below, all of the other layers of each resonator are the same.

Figure 4:
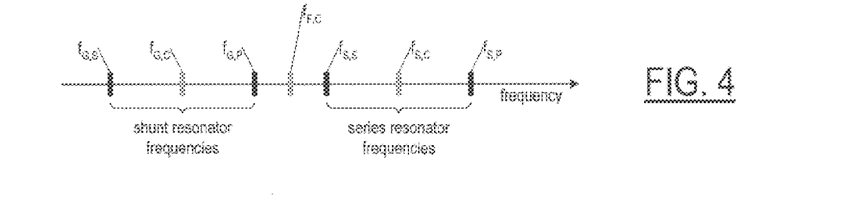
FIG. 4 is a diagram illustrating the value of the center frequency of a ladder filter (a single-stage ladder filter) compared to the values of the frequencies of the individual resonators making up the filter.

In a ladder filter, the shunt resonator is fabricated so as to have a lower resonant frequency than the series resonator; a thin tuning layer is often added to the shunt resonator to lower the frequency of the shunt resonator compared to the otherwise identical series resonator, although it is also possible to remove material from (usually the top electrode of) the series resonator to achieve the same object. Each BAW resonator has itself a series resonance and a parallel resonance (not to be confused with the series BAW resonator and the shunt BAW resonator of a BAW filter). The series resonance occurs at that frequency at which the applied electric field is in phase with the polarization it induces. The parallel resonance occurs at that frequency at which the applied electric field is 180 degrees out of phase with the polarization it induces. A ladder filter is usually designed so that the parallel resonance frequency of the shunt resonator ($f_{G,P}$) and the series resonance of the series resonator ($f_{S,S}$) are both at or close to the center frequency ($f_{F,C}$) of the filter, as indicated in FIG. 4. FIG. 4 also shows the center frequency ($f_{G,C}$) of the shunt resonator, lying midway between the parallel and series frequencies ($f_{G,P}$ and $f_{G,S}$) of the shunt resonator, and smaller in values than the center frequency ($f_{S,C}$) of the series resonator, which lies midway between the parallel and series frequencies ($f_{S,P}$ and $f_{S,S}$) of the series resonator.

Simply adding or subtracting material from layers other than the piezolayer allows a limited range of frequency pulling, a range inadequate for providing a multi-band filter with substantially different center frequencies, since adding material to a resonator (as opposed to fabricating a thicker piezolayer) decreases the achievable bandwidth of the device (in that it results in a lower effective coupling coefficient for the resonator, i.e. a less efficient coupling of electrical energy to acoustical energy and vice versa) and decreasing the thickness of for example the top electrode increases the electric resistivity (resulting in a higher insertion loss when the device is used as part of a filter). These problems can be avoided if the piezolayer is fabricated to have a different thickness for each filter, as shown in FIG. 1.

The invention provides for a method for fabricating a multi-band filter consisting of various BAW resonators with substantially different piezolayers, all mounted on a single substrate, as shown in FIG. 1. According to the invention, to fabricate filters for substantially different mobile bands, the piezolayer thickness is made different for each band in one of two ways: either the piezolayer is deposited in stages, from the thickness corresponding to the highest frequency resonators and adding material (in places) until the thickness corresponding to the lowest frequency resonator is deposited; or the piezolayer is deposited to a thickness corresponding to the lowest frequency resonator and selectively removed. Two different implementations of the first method are described below, and one implementation of the second method.

Figure 5A:
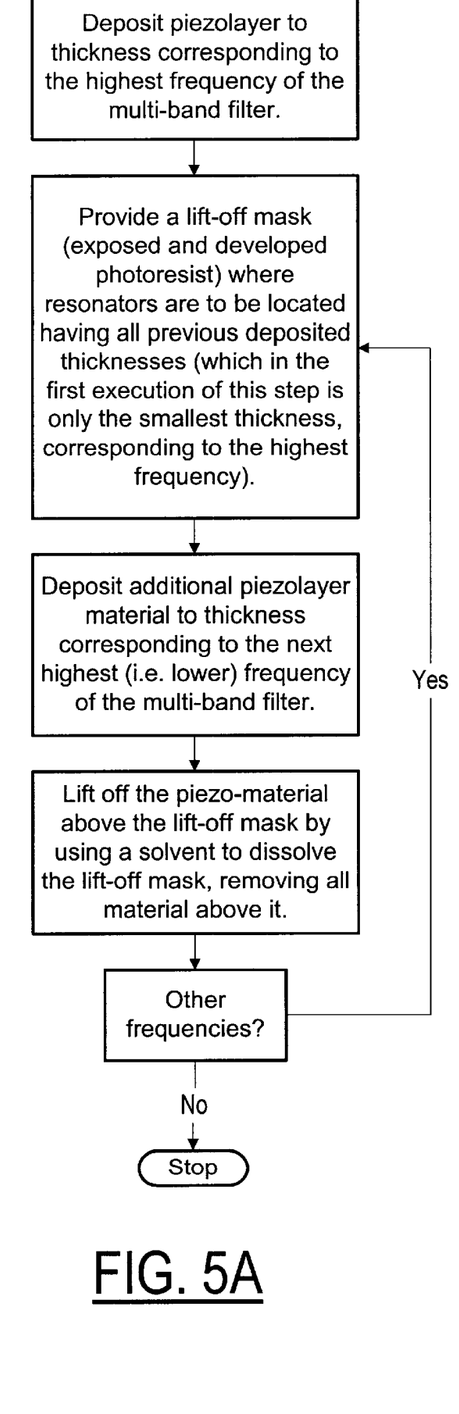
FIGS. 5A and 5B are flowcharts of two implementations of a method of fabricating a multi-band BAW filter on a single substrate, according to a first embodiment of the invention, one in which the piezolayer is deposited in stages.
Figure 7:
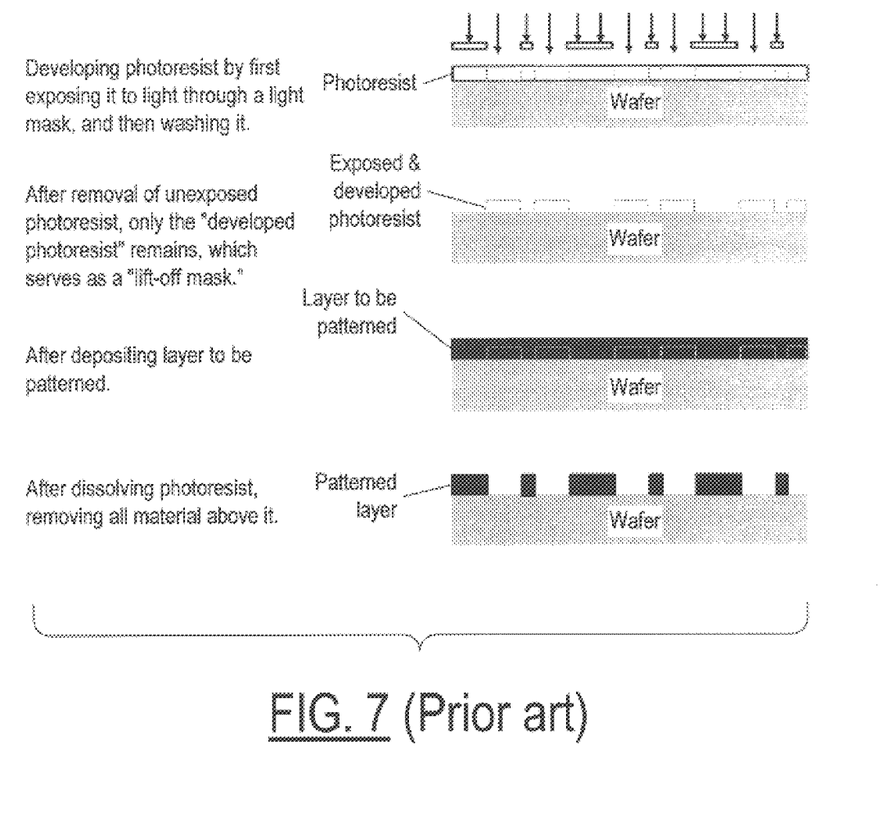
FIG. 7 is an illustration of using a so-called lift-off mask, according to the prior art.
Figure 8A:
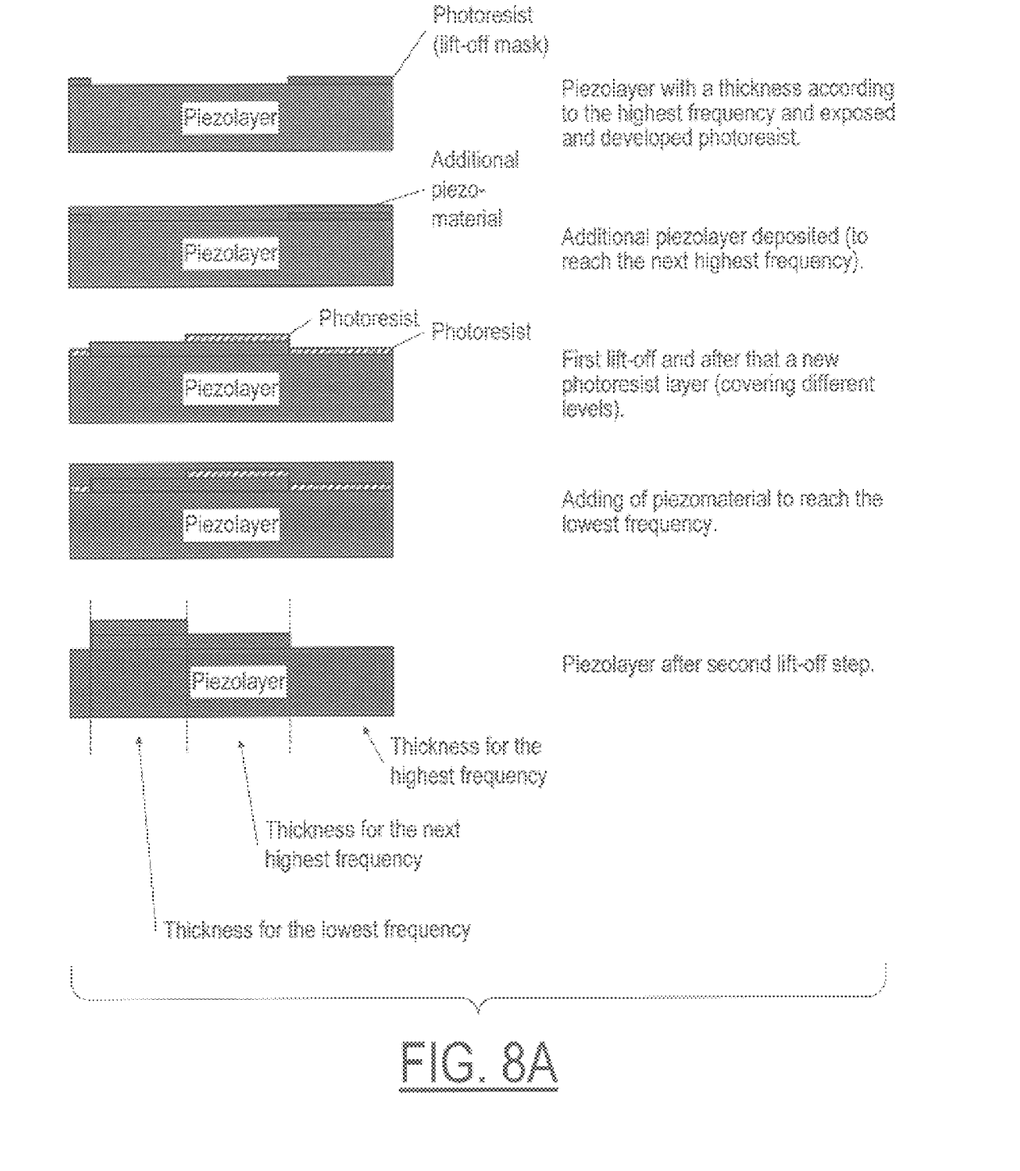
FIG. 8A is an illustration of the method flowcharted in FIG. 5A.

Referring now to FIGS. 5A and 8A, in a first implementation of the first method for fabricating a single-substrate multi-band BAW filter, the piezolayer is first deposited to the required thickness of the highest frequency band, then a so-called lift-off mask is applied to enable removing the yet-to-be-deposited piezo-material where the highest frequency resonators are to be located. By a lift-off mask is meant here an exposed (to light through a light mask) and developed layer of photoresist, which is then washed with for example a weak acid to remove the photoresist not exposed to light, leaving behind exposed and developed photoresist in only some places on the wafer. Material that is deposited on top of such a lift-off mask (developed and washed photoresist) can be removed by dissolving the photoresist. (The material on top of the lift-off mask comes off with the mask when the mask dissolves.) The use of a lift-off mask is illustrated in FIG. 7.

Still referring to FIGS. 5A and 8A, after the first lift-off mask is applied, additional piezo-material is deposited to a thickness corresponding to the next lower frequency band of the filter, some of the piezo-material ending up on top of the first lift-off mask. The first lift-off mask is then dissolved, so that it and the piezo-material on top of it are removed. Then a second lift-off mask is applied so that exposed and developed photoresist ends up wherever the highest frequency resonators are to be located, as well as the next highest (next lower) frequency resonators. Then additional piezo-material is deposited to a thickness corresponding to the next lower frequency band (the third band) of the filter, some of the piezo-material ending up on top of the second lift-off mask, which covers the piezo-material where the first and second highest frequency resonators are to be located. When the second lift-off mask is dissolved, a piezolayer remains having three different thicknesses, corresponding to three different resonator frequencies.

Figure 5B:
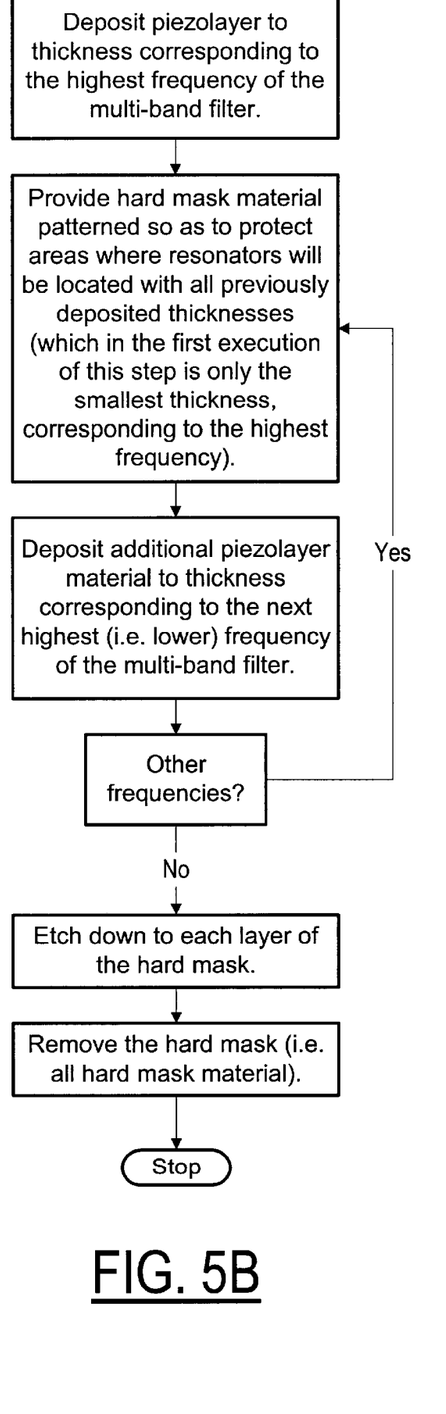
Figure 8B:
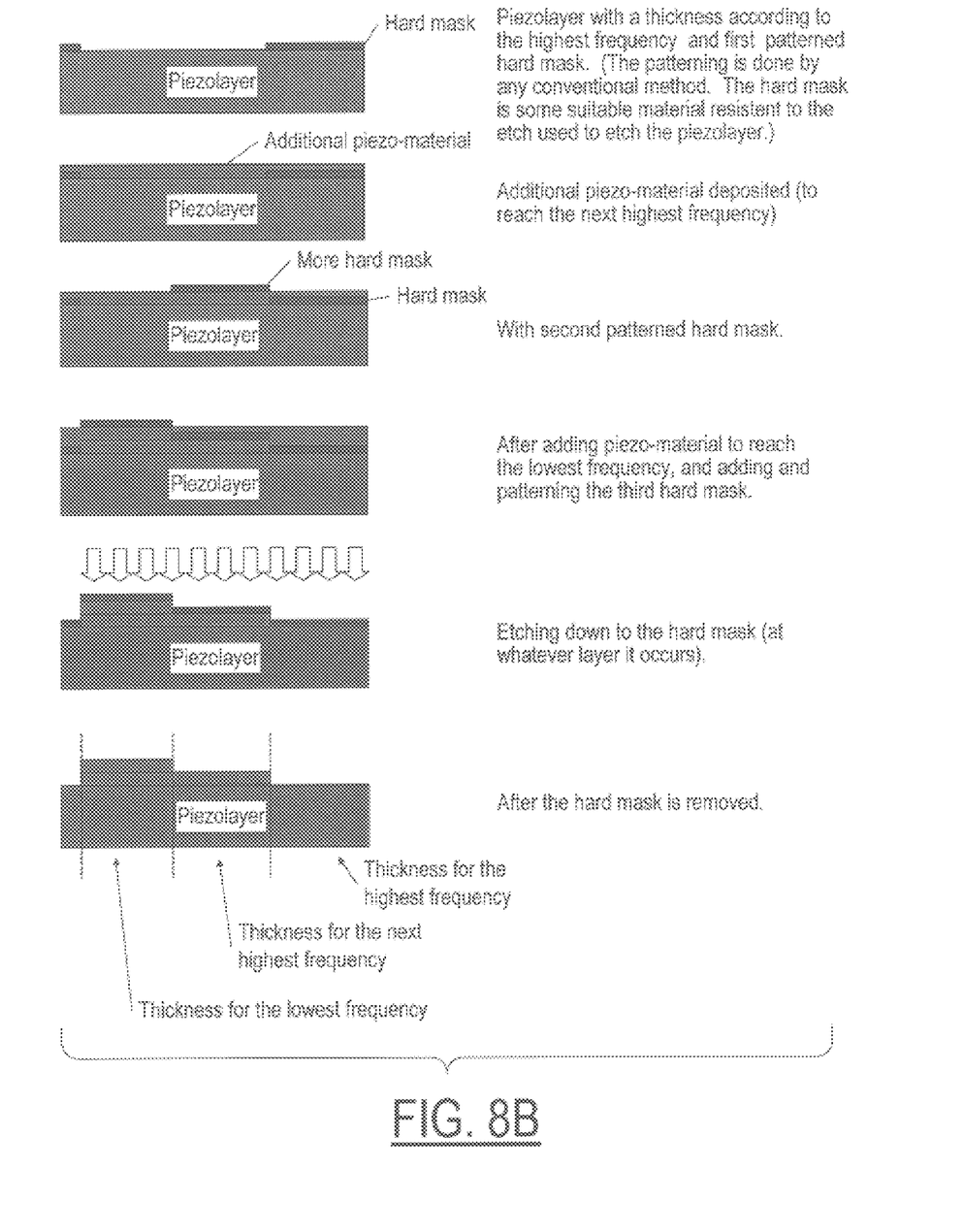
FIG. 8B is an illustration of the method flowcharted in FIG. 5B.

Referring now to FIGS. 5B and 8B, in a second implementation of the first method for fabricating a single-substrate multi-band BAW filter, the piezolayer is again first deposited to the required thickness of the highest frequency band, but now, instead of using a lift-off mask, a hard (protective) mask is applied to enable removing the yet-to-be-deposited piezo-material material everywhere except where the highest frequency resonators are to be located. A hard mask is any material, patterned as needed by conventional patterning methods, sufficiently resistant to the etching that will be used to remove the piezo-material deposited above it. Next, additional piezo-material is deposited to a thickness corresponding to the next lower frequency hand of the filter, some of the piezo-material ending up on top of the hard mask. Then more hard mask is applied and patterned so that it ends up wherever the next highest (next lower) frequency resonators are to be located. Then additional piezo-material is deposited to a thickness corresponding to the next lower frequency band of the filter, the third band. Then more hard mask is applied and patterned so that it ends up wherever the next highest (the third band) frequency resonators are to be located, protecting the third band material from etching. Next, the surface is etched, so that all material above any hard mask material is removed. It is also possible to remove the excess piezolayer after each hard mask deposition, instead of doing so as the last step. Finally, the hard mask is removed by some suitable wet etch that does not etch the piezo-material.

In the preferred embodiment of the first method, to ensure continued growth of well-oriented piezo-material after the application of the one or more masks, the piezo-deposition process should be refined, such as for example by including a short pre-etch in a sputtering chamber, before starting the additional deposition, so as to clean the surface of the piezolayer.

Figure 6:
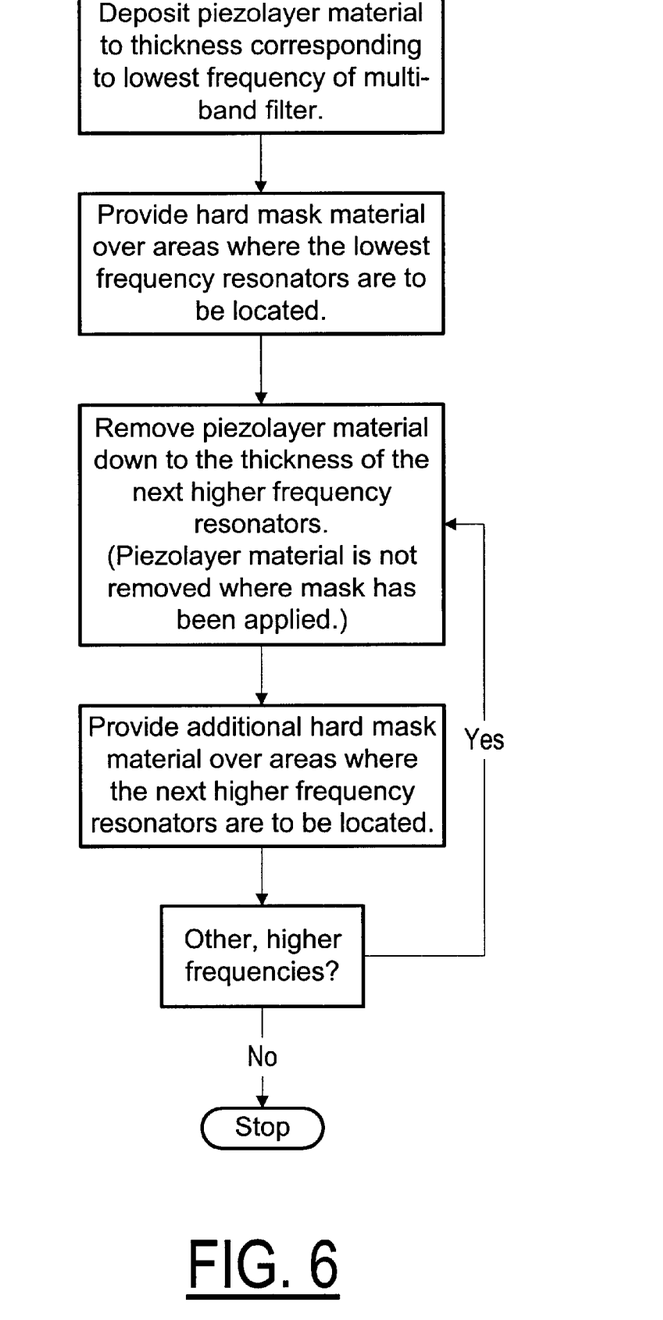
FIG. 6 is a flowchart of a method of fabricating a multiband BAW filter on a single substrate, according to a second embodiment of the invention, one in which the piezolayer is deposited in a single step, after which material is selectively removed from the piezolayer.
Figure 9:
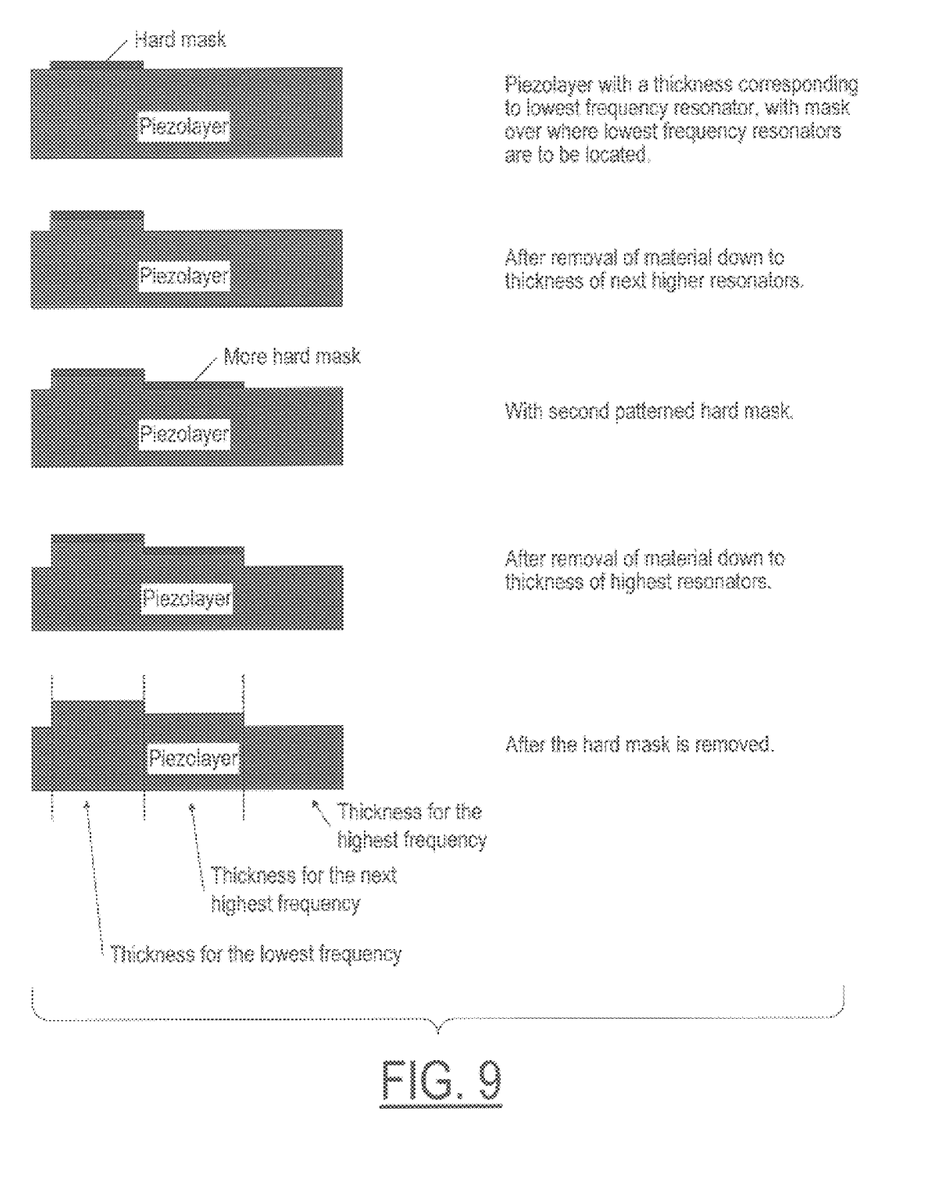
FIG. 9 is an illustration of the method flowcharted in FIG. 6.

Referring now to FIGS. 6 and 9, in a second, preferred embodiment of a method according to the invention for fabricating a single-substrate multi-band BAW filter, the piezolayer is first deposited to the thickness required by the lowest frequency, and then, in places on the substrate where the higher frequency resonators are to be provided, material is removed by use of one or more applications of hard (protective) mask material. As shown in FIG. 9, in case of a three-frequency (band) filter, two applications of hard mask material are used (the two applications being regarded here as a single hard mask). A first depositing of hard mask material covers or protects only the lowest frequency components. After etching to reach a piezolayer thickness required by the next higher components, a second application of hard mask material is made. The second application covers both the lowest and the next higher frequency components. Subsequent etching affects only the components intended for the highest frequency (third, highest band of the filter). The etching is preferably reactive ion beam etching (RIE), although wet etching is sometimes advantageous, depending on the materials. In this second method, the amount of material removed by etching is controlled only by controlling the etching time.

The second method requires the same number of masks as the first implementation (lift-off mask implementation) of the first method, but is easier to perform. The principal difference between either implementation of the first method and the second method is that in the second method, the piezolayer is deposited in one step, and is then thinned down in subsequent steps, avoiding the possible problems of well-oriented growth the first method tends to have.

In both methods, after the piezolayer is completed for each resonator, the top electrode is deposited, and an additional tuning layer is provided on the top electrode of each shunt resonator. It is sometimes advantageous to pattern the piezolayer, the electrodes, and the mirror layers after each such layer is deposited.

After providing the various thicknesses of piezolayer, a tuning layer is usually provided for each shunt resonator for each band. Such a tuning layer is provided in the same way as additional thicknesses of the piezolayer corresponding to the different bands of the filter, i.e. using either of the two implementations of the first method, or using the second method.

To provide a multi-band filter consisting of two or more ladder-type filters, each ladder-type filter consisting of one or more L-sections connected in series, each L-section consisting of a series resonator and a shunt resonator, the different series connections of the different L-sections of each filter are made on the wafer as part of the process of depositing the individual resonators on the wafer, and the chips containing the multi-band filters are then sawed from the wafer.

The methods of the invention are applicable to both acoustic mirror and bridge-type resonators, i.e. to either type of isolation structure, but in case of mirror-type resonators, the bandwidth of the acoustic mirror has also to be taken in to account. Usually, an acoustic mirror for a resonator used as a component of a filter consists of various layers of alternating high and low acoustic impedance, with each such layer provided at a thickness of one quarter of the (acoustic) wavelength of an acoustic wave at the center frequency of the filter so that the mirror operates well only at the center frequency of the filter. An acoustic mirror can, however, be designed so that it exhibits a reasonable reflection coefficient within a fairly large frequency range, and an acoustic mirror according to such a design is what is needed in fabricating a multi-band filter on a single substrate, with each component BAW resonator using an acoustic mirror of identical construction, as shown in FIG. 1. It is often advantageous to optimize the mirrors for the average of all of the center frequencies (so that in the example of FIG. 1, the mirror would be optimized for the GSM filter at 1.8 GHz). However, bandwidth requirements must also be considered; if one of the filters requires a significantly wider bandwidth, then it is often more advantageous to optimize the mirror for the center frequency of that filter (which, fortuitously, in the case of the example of FIG. 1 is again the 1.8 GHz frequency of the GSM filter).

It is to be understood that the above-described arrangements are only illustrative of the application of the principles of the present invention. In particular, the present invention is intended to comprehend multi-band BAW filters using any kind of isolation structure, not only an acoustic mirror, but also a bridge, since as would be clear to one of ordinary skill in the art, nothing about the method of the invention restricts it to providing on the same substrate only several acoustic-mirror type resonators (with substantially different frequencies). In addition, the present invention clearly applies to providing filters according to other topologies besides those of the particular example used to illustrate the present invention, such as for example, a filter based on a single BAW series resonator and a shunt capacitor, as in the GPS filter of the example, or based on a series capacitor and a single BAW shunt resonator. Numerous other modifications and alternative arrangements may be-devised by those skilled in the art without departing from the spirit and scope of the present invention, and the appended claims are intended to cover such modifications and arrangements.

What is claimed is:

1. A method of fabricating a plurality of bulk acoustic wave (BAW) resonators on a single substrate, the plurality of BAW resonators including BAW resonators from at least two different filters having substantially different resonant center frequencies, the plurality of BAW resonators thus including BAW resonators having substantially different resonant frequencies, the method comprising the steps of:
    a) providing a substrate having an upper facing surface;
    b) depositing an isolation structure on the upper facing surface of the substrate;
    c) depositing a first metallic layer on the isolation structure, the first metallic layer serving as a bottom electrode; and
    d) depositing piezolayer material on the bottom electrode so as to have thicknesses corresponding to each of the different resonant frequencies, each different thickness located in a location where a resonator having a resonant frequency corresponding to the thickness is to be located;

wherein the step of depositing piezolayer material on the bottom electrode includes a step of incrementally adjusting the thickness of the piezolayer where at least one electrode is to be located.

2. The method of claim 1, wherein the step of depositing piezolayer material on the bottom electrode comprises the steps of:
    a) depositing piezolayer material to a thickness corresponding to the lowest frequency resonator;
    b) providing hard mask material over areas where the lowest frequency resonators are to be located; and
    c) removing the piezolayer material down to the thickness of the next higher frequency resonators.

3. A plurality of bulk acoustic wave (BAW) resonators on a single substrate fabricated according to the method of claim 2.

4. The method of claim 1, wherein the step of depositing piezolayer material on the bottom electrode comprises the steps of:
    a) depositing the piezolayer material to a thickness corresponding to the highest frequency;
    b) depositing a lift-off mask where the highest frequency resonators are to be located;
    c) depositing additional piezolayer material to a thickness corresponding to the next highest frequency; and
    d) removing the lift-off mask.

5. A plurality of bulk acoustic wave (BAW) resonators on a single substrate fabricated according to the method of claim 4.

6. The method of claim 1, wherein the step of depositing piezolayer material on the bottom electrode comprises the steps of:
    a) depositing the piezolayer material to a thickness corresponding to the highest frequency;
    b) depositing hard mask material where the highest frequency resonators are to be located;
    c) depositing additional piezolayer material to a thickness corresponding to the next highest frequency; and
    d) depositing hard mask material where the next highest frequency resonators are to be located.

7. The method of claim 1, wherein the isolation structure is an acoustic mirror, and wherein the method further comprises the step of: providing the acoustic mirror, interposed between the substrate and the bottom electrode, according to a design that imparts to the acoustic mirror a desired reflection coefficient over a predetermined range of frequency including the substantially different resonant frequencies.

8. A plurality of bulk acoustic wave (BAW) resonators on a single substrate fabricated according to the method of claim 1.

9. A multi-resonator chip, in which a plurality of bulk acoustic wave (BAW) resonators are provided on a single substrate, at least two of the BAW resonators for use in different filters having substantially different center resonant frequencies, the plurality of BAW resonators thus including BAW resonators having substantially different resonant frequencies, the multi-resonator chip comprising:
    a) a substrate having an upper facing surface;
    b) an isolation structure on the upper facing surface of the substrate;
    c) a plurality of resonator sections, each resonator section comprising in turn a pair of electrodes in between which a piezolayer is provided at a thickness corresponding to the resonant frequency of the resonator section;

wherein the at least two of the BAW resonators having substantially different resonant frequencies have piezolayers differing substantially in thickness, the different thicknesses corresponding to the substantially different resonant frequencies.

10. The multi-resonator chip of claim 9, wherein the isolation structure is an acoustic mirror provided according to a design that imparts to the acoustic mirror a desired reflection coefficient over a predetermined range of frequency including the substantially different resonant frequencies.

* * * * *

UNITED STATES PATENT AND TRADEMARK OFFICE
CERTIFICATE OF CORRECTION

PATENT NO. : 6,518,860 B2
DATED : February 11, 2003
INVENTOR(S) : Juha Ellä and Helena Pohjonen

It is certified that error appears in the above-identified patent and that said Letters Patent is hereby corrected as shown below:

<u>Column 5,</u>
Line 58, "lower frequency hand of" should be -- lower frequency band of --.

<u>Column 7,</u>
Line 43, "arrangements may be-devised" should be -- arrangements may be devised --.

Signed and Sealed this

Twenty-fifth Day of March, 2003

JAMES E. ROGAN
*Director of the United States Patent and Trademark Office*